United States Patent [19]

Joost

[11] Patent Number: 5,574,366
[45] Date of Patent: Nov. 12, 1996

[54] PROXIMITY SWITCH HAVING A VARIABLE SENSING RESISTOR FOR MAINTAINING A CONSTANT TOTAL RESISTANCE

[75] Inventor: Friedhelm Joost, Essen, Germany

[73] Assignee: Tiefenbach GmbH, Essen, Germany

[21] Appl. No.: 116,244

[22] Filed: Sep. 2, 1993

[30] Foreign Application Priority Data

Sep. 2, 1992 [DE] Germany ............................ 42 29 225.5
Sep. 10, 1992 [DE] Germany ............................ 42 30 270.6

[51] Int. Cl.$^6$ ...................................................... G01B 7/14
[52] U.S. Cl. ............... 324/207.26; 324/225; 324/207.12; 324/207.16; 340/870.31; 331/65
[58] Field of Search ............ 324/207.26, 207.11–207.16, 324/207.22, 225, 226, 234, 236, 239; 340/686, 870.31; 331/65, 117 R, 167

[56] References Cited

U.S. PATENT DOCUMENTS

| 3,941,338 | 3/1976 | Knudsen ................................. 246/77 |
| 4,613,830 | 9/1986 | Kamiga et al. ...................... 324/236 X |
| 4,618,835 | 10/1986 | Wilson ................................ 324/327 X |
| 4,672,230 | 6/1987 | Spahn ................................. 324/207.26 |
| 4,731,591 | 3/1988 | Weigand ............................. 324/236 X |
| 4,803,444 | 2/1989 | Takahashi .......................... 324/236 X |
| 5,043,661 | 8/1991 | Dubey ................................ 324/207.12 |
| 5,079,502 | 1/1992 | Rogacki et al. ................... 324/207.26 |

FOREIGN PATENT DOCUMENTS

| 358626 | 6/1974 | Austria . |
| 378522 | 7/1980 | Austria . |
| 0340660 | 4/1989 | European Pat. Off. . |
| 869809 | 10/1949 | Germany . |
| 1516589 | 1/1965 | Germany . |
| 1530408 | 10/1965 | Germany . |
| 1605427 | 7/1967 | Germany . |
| 21 64 601 | 12/1971 | Germany . |
| 2 228 679 | 6/1972 | Germany . |
| 31 50 546 | 12/1981 | Germany . |
| 33 39 478 | 10/1983 | Germany . |
| 35 19 222 | 5/1985 | Germany . |
| 37 21 127 | 6/1987 | Germany . |
| 0054801 | 4/1982 | Japan ............................... 324/207.26 |

OTHER PUBLICATIONS

Japanese Abstract, JP54–153058, Jan. 26, 1980.

*Primary Examiner*—Sandra L. O'Shea
*Assistant Examiner*—Jay M. Patidar
*Attorney, Agent, or Firm*—Bell, Seltzer, Park & Gibson, P.A.

[57] ABSTRACT

A proximity switch for determining the approach of a metal object includes an oscillating circuit which has a coil and a capacitor, and which produces a high-frequency field at the poles of the coil. A sensing resistor is connected to the oscillating circuit and serves to determine and evaluate the damping of the oscillating circuit by the object. Also, the sensing resistor is controlled as a function of the current measured in the sensing resistor such that the total resistance of the evaluation circuit remains constant. The voltage drop across the sensing resistor is measured and the measured voltage drop may be used to signal the approach of the metal object.

5 Claims, 3 Drawing Sheets 5,574,366

PROXIMITY SWITCH HAVING A VARIABLE SENSING RESISTOR FOR MAINTAINING A CONSTANT TOTAL RESISTANCE

BACKGROUND OF THE INVENTION

The present invention relates to a proximity switch for detecting the approach of objects of metallic material, of the type disclosed in EP 340 660 A2 and DE-A 37 21 127.

In the known proximity switches, an oscillating circuit is provided which includes a coil, and which is connected to a source of constant voltage. The electromagnetic damping of the coil is determined, and more particularly, the adjacent position and/or state of motion of the metallic object is signalled by detecting and evaluating the voltage drop which occurs across an internal sensing resistor which is connected to the oscillating circuit.

It is the object of the invention to increase the response time and sensitivity of the proximity switch of the described type.

SUMMARY OF THE INVENTION

The above and other objects and advantages of the present invention are achieved by the provision of a proximity switch which comprises an oscillating circuit which includes a coil which is adapted to produce a magnetic field, and a sensing resistor which is connected to the oscillating circuit. Means are provided for adjusting the resistance of the sensing resistor so that the resistance thereof is varied as a function to the sensed current and so that the total resistance of the oscillating circuit and the sensing resistor remains constant. Means are also provided for monitoring the voltage drop across the sensing resistor as a measure of the amount of damping of the oscillation circuit caused by the approach of a metal object into the magnetic field of the coil.

The present invention ensures that, irrespective of the actual local position and state of motion of the metallic object, the proximity switch is always supplied with the same energy, whereas in the known proximity switches, a weak damping also resulted in only a low supply of power, and thus in a sluggish and weak output signal. In accordance with the invention, the internal resistance which is present in the oscillating circuit is varied such that the current flowing through the oscillating circuit, and thus the current serving for the measuring, remains constant. To this end, the current is measured, and the sensing resistor which may be provided with a transistor, is triggered accordingly.

BRIEF DESCRIPTION OF THE DRAWINGS

Some of the objects and advantages of the present invention having been stated, others will appear as the description proceeds, when taken in conjunction with the accompanying drawings, in which.

DETAILED DESCRIPTION OF THE PREFERRED EMBODIMENT

Figure 1:
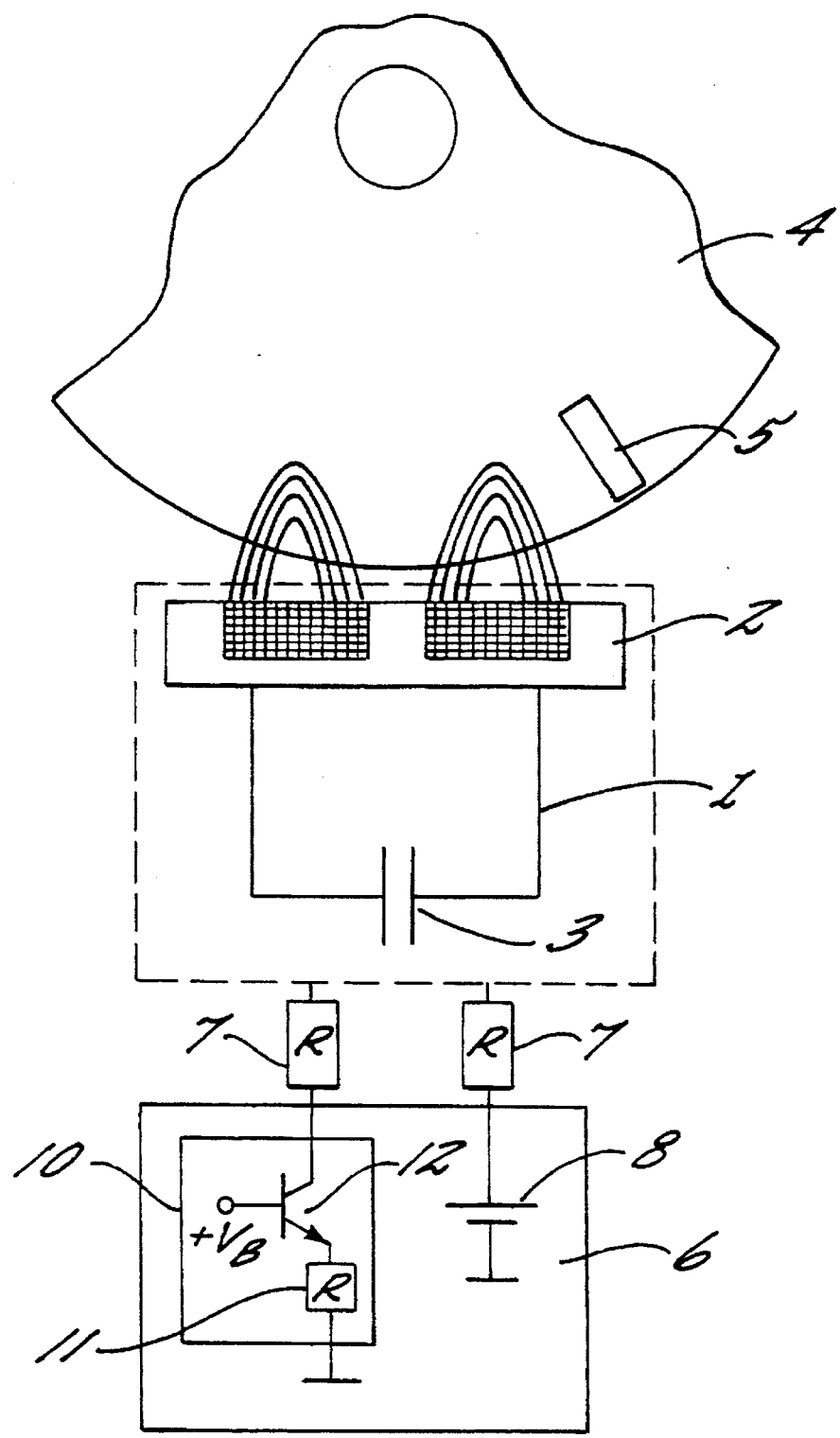
FIG. 1 is a schematic circuit diagram of a proximity switch which embodies the present invention.

The proximity switch of the present invention includes as basic elements an oscillating circuit 1 which comprises a capacitor 3 as well as a coil 2. At the free pole of the coil, which is not covered by a ferrite material, a metallic object 4 passes by which may, but need not, have ferromagnetic properties. In FIG. 1, this object is the wheel of a gearing with a metallic insert 5. When the wheel is that of a vehicle, the metallic insert is absent. In this instance, the proximity switch is arranged at a fixed location. The embodiment of FIG. 1 includes a sectional view of a coil 2, which generates a high-frequency alternating field. As a result of the adjacent position of insert 5 or the adjacent position of wheel 4 with respect to the stationary proximity switch, the oscillating circuit which includes the coil, is more or less damped. With arrangement of two coils in series as seen in FIG. 1, the coils are subjected one after the other to the influence of the insert, and the resulting damping thereof allows to ascertain, in addition to the number of revolutions or speed, the direction of rotation of the gearing wheel 4 or the direction of movement of vehicle wheel 4.

Furthermore, the proximity switch is provided with a voltage supply and evaluation circuit 6. The latter is electrically connected with the oscillating circuit. The evaluation circuit includes a voltage supply element 8 which supplies the oscillating circuit with a voltage (for example, of constant 8 volts). As seen in the electric circuit diagrams of FIGS. 2 and 3, the electric circuit comprises a source of voltage 8 and the oscillating circuit 1. In addition, the circuit will include line resistances 7, as well as an internal resistance 9 of the oscillating circuit and a sensing resistor 10 in the evaluation circuit 6. The electric circuit comprising oscillating circuit 1, source of voltage 8, line resistors 7, and the internal resistance 9 of oscillating circuit is connected with the sensing resistor 10, which is connected to ground. In the sensing resistor, a voltage drop occurs which is dependent on the damping of the coil of the oscillating circuit. In the embodiment of the prior art shown in FIG. 3 (and in accordance with German Industrial Standards DIN 19234), the sensing resistance is constant. Thus the total resistance of the circuit increases, when the coil of the oscillating circuit is damped, so that the current decreases, and accordingly the voltage drop in sensing resistor 10 also decreases or increases, as the damping decreases. At the same time, the power available for measuring and evaluation, i.e. for the restart of oscillations, varies. This disadvantage is avoided in the embodiment of FIG. 2, wherein the sensing resistor 10 is adjustable. The latter is, for example, an activatable transistor 12. The transistor is triggered by a measuring signal such as by sensor means, which measures the amperage in an additional internal resistor 11 in the sense that when the current decreases, the resistance decreases likewise, and thus the current flowing through the overall circuit is kept constant. Thus, the total resistance of the circuit with source of voltage 8, line resistances 7, and oscillating circuit 1 remains constant. However, the voltage drop in variable sensing resistor 10 changes, since the value of the sensing resistance also changes. It is therefore possible, as has been in the past, to determine and evaluate this voltage drop as a measure for the amount of damping of the oscillating circuit. Since the current remains constant, adequate power will always be available.

The disadvantage of the prior art circuit is that the damping by metallic objects causes the resistance of the oscillating circuit to increase, and as a result the voltage applied to the oscillator increases likewise, which counteracts damping by the metallic object. Conversely, after a reduction of damping, the oscillating circuit restarts to build up only slowly because of the constant sensing resistance and the reduced available power. Thus, the system of the prior art is very sluggish.

Figure 2:
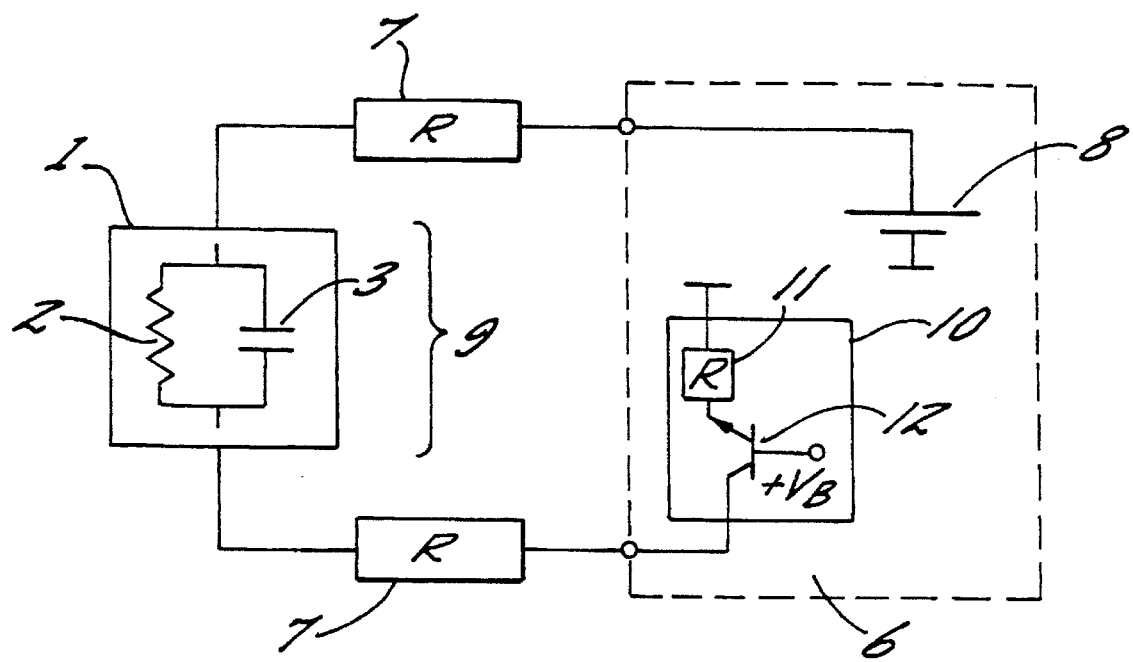
FIG. 2 is a circuit diagram of the proximity switch of another embodiment of the invention.
Figure 3:
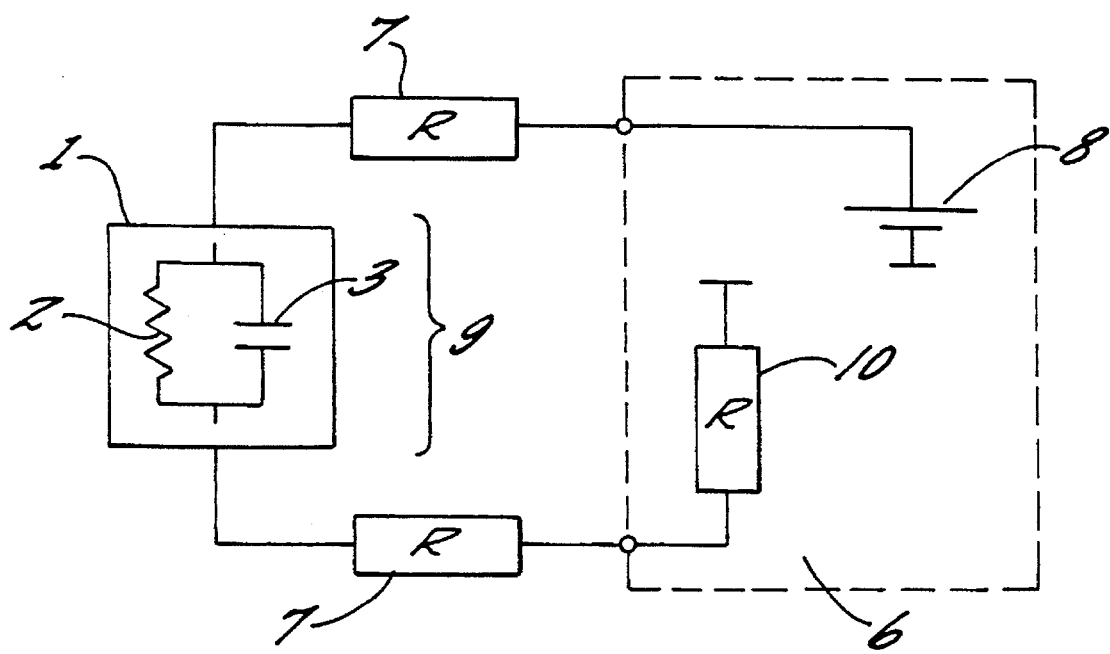
FIG. 3 is a circuit diagram of a conventional proximity switch as known in the prior art.

However in a circuit of FIG. 2, when the oscillating circuit is damped by a metal object, the internal resistance of the oscillator increases likewise, whereas the total resistance of the overall circuit remains constant, so that the current flowing through the oscillating circuit also remains constant. As a result, it is accomplished that the oscillating circuit responds to a damping or recovery very rapidly and sensitively. It is possible, because of the constant current of the sensing resistance, to detect metallic objects from a relatively great distance, without having to fear interference signals.

The application of the present invention makes it also possible to arrange two proximity switches in direct vicinity to one another, and to evaluate the received signals jointly, for example, with the use of a circuit in accordance with a resistor-transistor circuit disclosed in DE 37 21 127 C and EP 0 340 660 A. As a result, it becomes possible to determine also the direction of movement of metallic objects, as they pass by, or the direction of rotation of metallic objects.

Figure 4A:
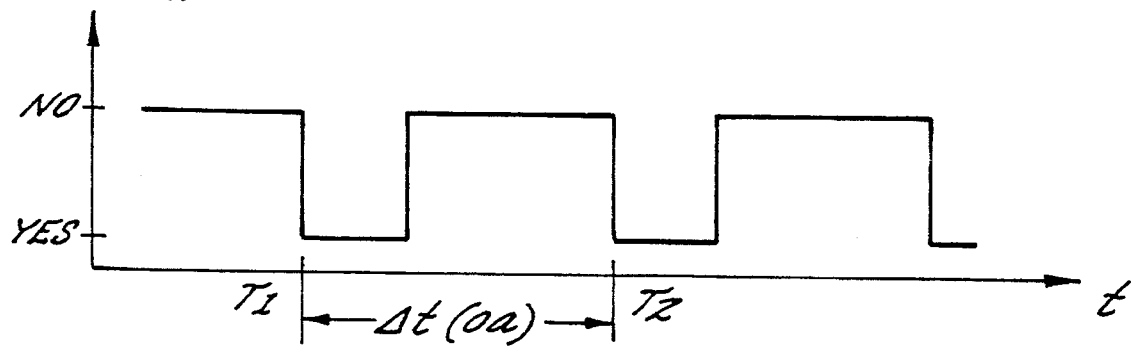
FIGS. 4a–4c are schematic diagrams illustrating the oscillatory voltage vs. time in accordance with the prior art (4b) and the present invention (4c) caused by the approach of several objects.
Figure 4B:
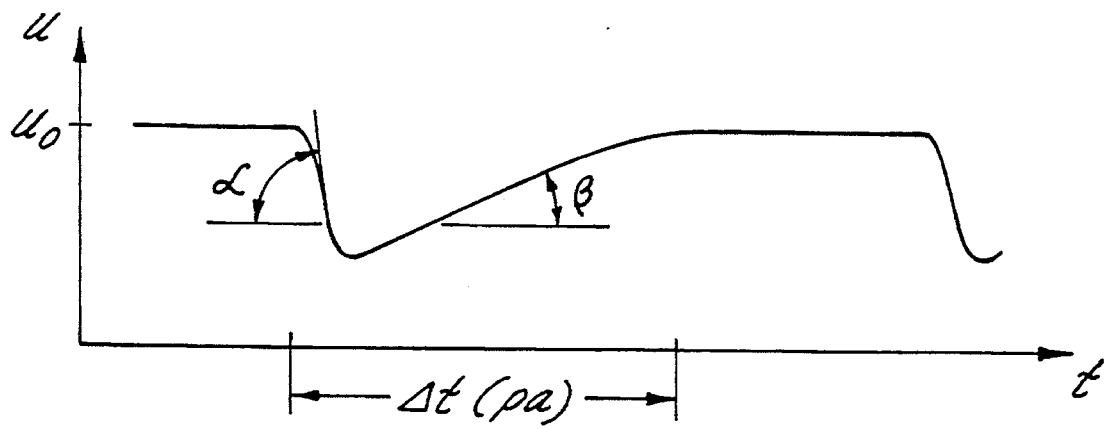
Figure 4C:
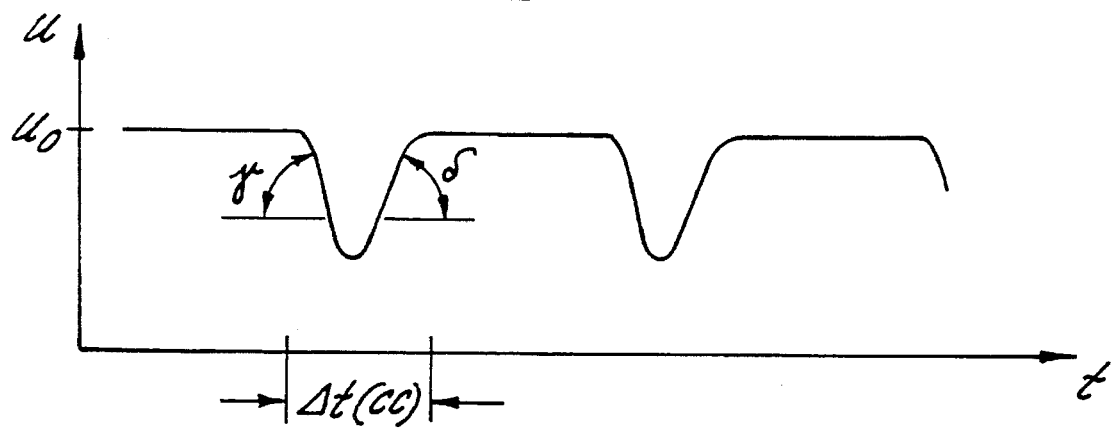

FIG. 4a to 4c show schematic diagrams of the oscillatory voltage U vs. time in cases of proximity switches according to that of the prior art (=index pa) and to that of a constant current (=index cc) caused by objects' approaches (index oa).

FIG. 4a shows the impulses caused by each of the objects' approaches. First object approaches at time T1, followed by the second object's approach at the time T2. Between the approaches there is a time-interval of delta t(oa).

Each of the impulses given by the objects will cause damping of the oscillatory circuit. This damping will cause immediately a drop of oscillatory circuit voltage U from the upper level $U_o$ as can be seen in FIG. 4b, c.

Even if U is an oscillatory circuit voltage, it is drawn with straight lines, because its amplitude is very small, if compared with the voltage drop caused by the damping effect.

As shown in FIG. 4b, the decreasing voltage will reach a minimum level after very short time. This decrease is in accordance with the angle alpha. After reaching the minimum level, the oscillatory circuit voltage will increase again to the upper level $U_o$ within a rather long time. This gradient is equivalent to the angle beta, which is, compared with the angle alpha, much smaller.

After the oscillatory circuit voltage U has reached the former level $U_o$, the oscillatory circuit is able to detect another object's approach. But in this case, the second object has caused its respective impulse at time T2, after a time interval delta t being shorter than the time interval being necessary for stabilizing the oscillatory circuit at $U_o$ again.

For this reason, the oscillatory circuit is not able to detect the second object's approach.

As can be seen, the time delta t(pa) for restabilizing the oscillatory circuit is longer than the time delta t(oa) between the first and second object's approach.

This rather long time interval delta t(pa) is caused by the fact that adapting of total resonant-circuit resistance during the phase of damping is impossible with prior art oscillatory circuits.

This schematic diagram therefore is in accordance with the decreasing and increasing oscillatory circuit voltage U at proximity switches of prior art, wherein the oscillatory circuit voltage cannot be stabilized by controlling the flowing current during the phase of increasing voltage.

FIG. 4c shows a schematic diagram of an oscillatory circuit in accordance with the present invention, comprising a constant current circuit as per the invention.

As can be seen, the damping effect during the first object's approach will cause a sudden decrease of the oscillatory circuit voltage U. This decrease is comparable with the voltage drop in case of FIG. 4b.

After reaching the minimum level, the oscillatory circuit voltage will increase more quickly than in case of FIG. 4b, because the total resonant-circuit resistance is continuously controlled at a constant value by adjusting the sensing resistor dependent on the sensed current. This is shown by the slope angle delta, which is, compared with angle beta of FIG. 4b, much greater.

For this reason, the former level $U_o$ of the oscillatory voltage U is reached after a very short time interval delta t(cc) and after that time interval has elapsed, the oscillatory circuit is stabilized again and prepared to detect the second object's approach at time T2.

This advantage is made possible only by continuously controlling of the total resistance of the oscillatory circuit by continuously adjusting the resistance of the sensing resistor as a function of the sensed current.

In this case, the whole possible energy of the oscillatory circuit can be used to reanimate the oscillatory circuit after being damped by the approach of an object.

In the drawings and specification, there has been set forth a preferred embodiment of the invention, and although specific terms are employed, they are used in a generic and descriptive sense only and not for purposes of limitation.

That which is claimed is:

1. A proximity switch for detecting the approach of an object of metallic material and comprising an oscillating circuit which includes a first coil for producing a magnetic field, the oscillating circuit including an internal resistance which varies inversely to a distance between the oscillating circuit and an approaching metal object, sensing resistor means having a resistance and connected in series with said oscillating circuit, said sensing resistor means including means for adjusting the resistance of the sensing resistor means in relation to variations in the internal resistance of the oscillating circuit so that a total resistance of said oscillating circuit and said sensing resistor means remains constant as the metal object approaches, and means for monitoring a voltage drop across said sensing resistor means as a measure of an amount of damping of the oscillation circuit caused by the approach of the metal object into the magnetic field of said first coil.

2. The proximity switch as defined in claim 1 wherein said means for adjusting the resistance of the sensing resistor means includes sensor means for sensing the current flowing through said sensing resistor means and adjusting the resistance of the sensing resistor means as a function of the sensed current.

3. The proximity switch as defined in claim 2 wherein said oscillating circuit further includes a constant voltage source.

4. The proximity switch as defined in claim 3 wherein said oscillating circuit further includes a second coil mounted in series with the first coil.

5. The proximity switch as defined in claim 1 wherein said sensing resistor means comprises:

a resistor; and a transistor, responsive to the current flowing through said resistor, having a variable resistance which directly varies in relation to the current flowing through said resistor such that the effective resistance of said resistor and said transistor varies in inverse relation to the internal resistance of said oscillating circuit so as to maintain the total resistance of said oscillating circuit and said sensing resistor means constant.

* * * * *